(12) United States Patent
Vaupel et al.

(10) Patent No.: US 11,655,143 B2
(45) Date of Patent: May 23, 2023

(54) SEMICONDUCTOR COMPONENT AND METHOD FOR PRODUCING SAME

(71) Applicant: Infineon Technologies AG, Neubiberg (DE)

(72) Inventors: Mathias Vaupel, Regensburg (DE); Bernhard Knott, Neumarkt (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 233 days.

(21) Appl. No.: 17/116,021

(22) Filed: Dec. 9, 2020

(65) Prior Publication Data
US 2021/0087054 A1 Mar. 25, 2021

Related U.S. Application Data

(63) Continuation of application No. 16/142,826, filed on Sep. 26, 2018, now Pat. No. 10,947,109.

(30) Foreign Application Priority Data

Oct. 5, 2017 (DE) ...................... 10 2017 123 175.7

(51) Int. Cl.
*B81B 7/00* (2006.01)
*H01L 23/04* (2006.01)
(Continued)

(52) U.S. Cl.
CPC ........ *B81B 7/0058* (2013.01); *B81C 1/00301* (2013.01); *H01L 21/31144* (2013.01); *H01L 21/52* (2013.01); *H01L 21/56* (2013.01); *H01L 23/04* (2013.01); *H01L 23/055* (2013.01); *H01L 23/16* (2013.01); *H01L 23/24* (2013.01);
(Continued)

(58) Field of Classification Search
CPC ... H01L 21/31144; H01L 21/52; H01L 21/56; H01L 23/04; H01L 23/055; H01L 23/06; H01L 23/16; H01L 23/24; H01L 23/3121; H01L 23/49541; H01L 23/49861; H01L 24/48; H01L 24/85; H01L 2224/73265
See application file for complete search history.

(56) References Cited

U.S. PATENT DOCUMENTS 6,260,417 B1 7/2001 Watanabe et al.
6,732,590 B1 5/2004 Gottlieb et al.
(Continued)

FOREIGN PATENT DOCUMENTS

CN 1675766 A 9/2005
CN 204391155 U 6/2015
(Continued)

*Primary Examiner* — Brook Kebede
(74) *Attorney, Agent, or Firm* — Harrity & Harrity, LLP

(57) ABSTRACT

A method for producing a semiconductor component is proposed. The method includes providing a housing. At least one semiconductor chip is arranged in a cavity of the housing. Furthermore, an electrical contact of the semiconductor chip is connected to an electrical contact of the housing via a bond wire. The method furthermore includes applying a protective material on the electrical contact of the housing and also on a region of the bond wire which is adjacent to the electrical contact of the housing. Moreover, the method also includes filling at least one partial region of the cavity with a gel.

25 Claims, 2 Drawing Sheets

(51) Int. Cl.
*H01L 23/24* (2006.01)
*H01L 23/498* (2006.01)
*H01L 23/16* (2006.01)
*B81C 1/00* (2006.01)
*H01L 21/311* (2006.01)
*H01L 21/52* (2006.01)
*H01L 21/56* (2006.01)
*H01L 23/055* (2006.01)
*H01L 23/31* (2006.01)
*H01L 23/495* (2006.01)
*H01L 23/00* (2006.01)

(52) U.S. Cl.
CPC .... *H01L 23/3121* (2013.01); *H01L 23/49541* (2013.01); *H01L 23/49861* (2013.01); *H01L 24/48* (2013.01); *H01L 24/85* (2013.01); *B81B 2201/0264* (2013.01); *H01L 23/49551* (2013.01); *H01L 2224/45144* (2013.01); *H01L 2224/48091* (2013.01); *H01L 2224/48247* (2013.01)

(56) References Cited

U.S. PATENT DOCUMENTS

| | | | |
|---|---|---|---|
| 2007/0269933 A1 | 11/2007 | Hooper et al. | |
| 2010/0199777 A1 | 8/2010 | Hooper et al. | |
| 2014/0146509 A1* | 5/2014 | Hooper | B81B 7/0038 156/60 |
| 2015/0090030 A1* | 4/2015 | Theuss | H01L 21/52 73/431 |
| 2016/0130136 A1* | 5/2016 | Singh | H01L 23/29 264/272.17 |
| 2017/0186927 A1 | 6/2017 | Naka et al. | |

FOREIGN PATENT DOCUMENTS

| | | |
|---|---|---|
| JP | 2005136378 A | 5/2005 |
| JP | 2015225942 A | 12/2015 |

* cited by examiner

SEMICONDUCTOR COMPONENT AND METHOD FOR PRODUCING SAME

CROSS-REFERENCE TO RELATED APPLICATIONS

This application is a continuation of U.S. patent application Ser. No. 16/142,826 filed Sep. 26, 2018, which claims the benefit of German Patent Application No. 10 2017 123 175.7 filed Oct. 5, 2017, which are incorporated by reference as if fully set forth.

FIELD

Exemplary embodiments are directed to a semiconductor component and also a method for producing same.

BACKGROUND

Semiconductor components or the housings thereof are often exposed to aggressive media. By way of example, semiconductor components for automotive applications have to be robust vis-à-vis severe environmental pollution. Purely by way of example, mention shall be made here of pressure sensors for charge air pressure measurement (e.g. in an exhaust gas recirculation system). The latter are exposed to corrosive substances such as, for instance, salt or else acids from the exhaust gases in combination with moisture. Particularly if semiconductor elements are not completely enclosed by their housing, interconnects (e.g. wires between various electrical contacts) within the housing may be particularly affected by corrosion.

SUMMARY

There is therefore a need to provide semiconductor components having an increased robustness vis-à-vis aggressive media.

The need can be met by the subject matter of the patent claims.

Exemplary embodiments of a method for producing a semiconductor component include providing a housing. At least one semiconductor chip is arranged in a cavity of the housing. Furthermore, an electrical contact of the semiconductor chip is connected to an electrical contact of the housing via a bond wire. The method furthermore includes applying a protective material on the electrical contact of the semiconductor chip and also on a region of the bond wire which is adjacent to the electrical contact of the semiconductor chip, and/or on the electrical contact of the housing and also on a region of the bond wire which is adjacent to the electrical contact of the housing. Moreover, the method also includes filling at least one partial region of the cavity with a gel.

Exemplary embodiments furthermore also relate to a semiconductor component. The semiconductor component includes a housing and at least one semiconductor chip arranged in a cavity of the housing. An electrical contact of the semiconductor chip is connected to an electrical contact of the housing via a bond wire. Furthermore, a protective material is applied on the electrical contact of the semiconductor chip and also on a region of the bond wire which is adjacent to the electrical contact of the semiconductor chip, and/or on the electrical contact of the housing and also on a region of the bond wire which is adjacent to the electrical contact of the housing. Moreover, at least one partial region of the cavity is filled with a gel.

BRIEF DESCRIPTION OF THE DRAWINGS

Some examples of devices and/or methods are explained in greater detail merely by way of example below with reference to the accompanying figures, in which.

DETAILED DESCRIPTION

Various examples will now be described more thoroughly with reference to the accompanying figures, in which some examples are illustrated. In the figures, the thicknesses of lines, layers and/or regions may be exaggerated for illustration purposes.

While further examples are suitable for various modifications and alternative forms, some specific examples thereof are correspondingly shown in the figures and are described thoroughly below. However, this detailed description does not restrict further examples to the specific forms described. Further examples can cover all modifications, counterparts and alternatives that fall within the scope of the disclosure. Throughout the description of the figures, identical reference signs refer to identical or similar elements which can be implemented identically or in modified form in a comparison with one another, while they provide the same or a similar function.

It goes without saying that if one element is designated as "connected" or "coupled" to another element, the elements can be connected or coupled directly or via one or more intermediate elements. If two elements A and B are combined using an "or", this should be understood such that all possible combinations are disclosed, i.e. only A, only B, and A and B. An alternative wording for the same combinations is "at least one from A and B". The same applies to combinations of more than 2 elements.

The terminology used here to describe specific examples is not intended to have a limiting effect for further examples. When a singular form, e.g. "a", "an" and "the", is used and the use of only a single element is defined neither explicitly nor implicitly as obligatory, further examples can also use plural elements in order to implement the same function. If a function is described below as implemented using a plurality of elements, further examples can implement the same function using a single element or a single processing entity. Furthermore, it goes without saying that the terms "comprises", "comprising", "has" and/or "having" in their usage make more precise the presence of the indicated features, integers, steps, operations, processes, elements, components and/or a group thereof, but do not exclude the presence or addition of one or more other features, integers, steps, operations, processes, elements, components and/or a group thereof.

Unless defined otherwise, all terms (including technical and scientific terms) are used here in their customary meaning in the field with which examples are associated.

Figure 1:
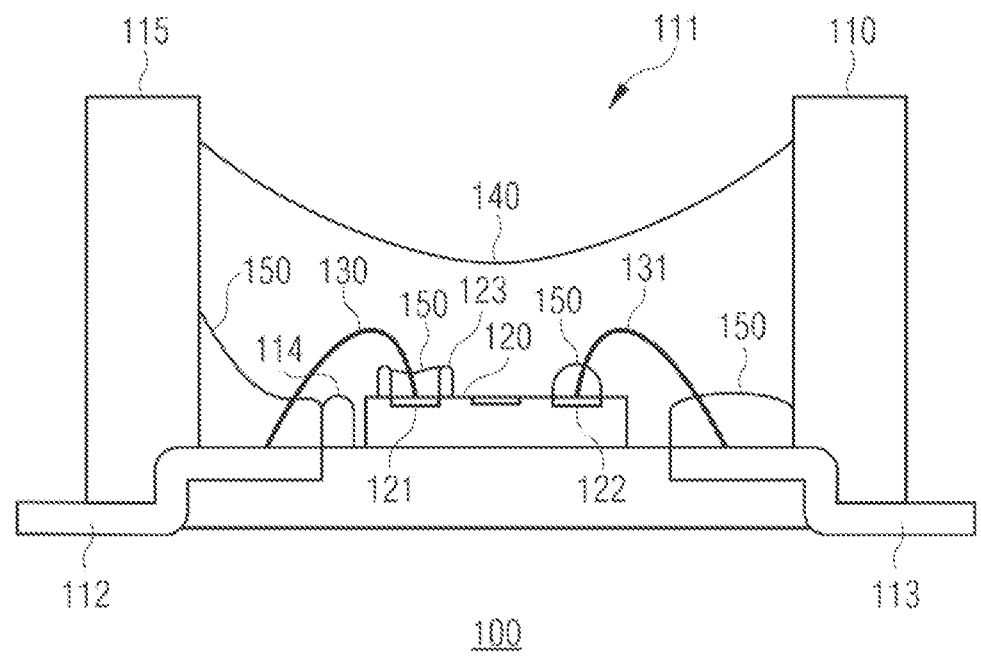
FIG. 1 shows a first exemplary embodiment of a semiconductor component.

FIG. 1 shows a semiconductor component 100. The semiconductor component 100 comprises a housing 110 and at least one semiconductor chip 120 arranged in a cavity 111 of the housing 110.

The housing 110 can thus be understood as a cavity package. The housing 110 can be for example a premold leadframe, i.e. a metal frame having a cavity shaped in the premold plastic (substrate). Likewise, the housing 110 can be for example a multilayered, ceramic housing in which the cavity is shaped. Moreover, instead of ceramic it is also possible to use any further material in order to shape a multilayered housing having a cavity (e.g. materials similar to those of printed circuit boards).

The semiconductor chip 120 can be any semiconductor element in chip form. By way of example, the semiconductor chip 120 can be a MicroElectroMechanical System (MEMS) sensor, such as a pressure sensor, for instance. In some exemplary embodiments, the semiconductor chip 120 can also be some other semiconductor element, such as an integrated circuit, for instance, or a combination of a MEMS sensor with some other semiconductor element. The semiconductor chip 120 is bonded (e.g. adhesively bonded or soldered) into the cavity 111.

An electrical contact 121 of the semiconductor chip 120 is connected to an electrical contact 112 of the housing 110 via a bond wire 130. The electrical contact 112 of the housing 110 delimits the cavity 111. The semiconductor chip 120 can have even further electrical contacts that are connected to further electrical contacts of the housing 110 via further bond wires. This is shown in FIG. 1 merely by way of example for the further electrical contact 122 of the semiconductor chip 120, which is connected to the further electrical contact 113 of the housing 110 via the further bond wire 131.

Via the electrical contact 112 (and also the further electrical contacts) of the housing 110, the semiconductor component 100 and thus the semiconductor chip 120 can be connected or coupled to further (external) entities (e.g. circuits, a power supply or data lines).

At least one partial region of the cavity 111 is filled with a gel 140. The gel 140 can be e.g. a (soft) silicone gel. If the semiconductor chip 120 is e.g. a MEMS pressure sensor, a good coupling of the MEMS pressure sensor (or the membrane thereof) to the pressure acting on the semiconductor component 100 can be achieved via the gel 140. Accordingly, a high quality of the pressure measurement can be achieved. Likewise, the gel 140 can enable protection against particles. Moreover, the gel 140 can limit a housing-induced, mechanical stress on the (stress-sensitive) semiconductor chip 120. Furthermore, the gel 140 can provide a degree of protection against corrosion for the open metal regions (e.g. the electrical contacts 112, 113, 121, 122 or the bond wires 130, 131). However, the protection against corrosion by means of the gel 140 alone is sometimes limited. By way of example, silicone gels may allow diffusion or permeation of aggressive media or substances to the open metal regions.

Therefore, a protective material 150 is additionally applied on the (entire) electrical contact 121 of the semiconductor chip 120 and also on (only) a region of the bond wire 130 which is adjacent to the electrical contact 121 of the semiconductor chip 120. Likewise, the protective material 150 is applied on the (entire) electrical contact 112 of the housing 110 and also on (only) a region of the bond wire 130 which is adjacent to the electrical contact 112 of the housing 110.

Applying the protective material 150 on the electrical contacts 112, 121 and also on the regions of the bond wire 130 which are adjacent to the electrical contacts 112, 121 can reduce a susceptibility of these elements to corrosion since it has a better robustness vis-à-vis aggressive media or chemicals (chemical gases) than the gel 140. Accordingly, a robustness of the semiconductor component 100 vis-à-vis aggressive media or chemicals can be increased. A reliability of the semiconductor component 100 can thus be improved. The protective material 150 can be selected in accordance with its protection capability vis-à-vis the substances against which the open metal regions of the semiconductor component 100 are intended to be protected. The protective material 150 can have e.g. a coefficient of thermal expansion similar to that of the material of the bond wire 130 (e.g. gold). By way of example, the protective material can be an epoxy resin, a silicone, an imide, a polymer, a synthetic resin, a polyurethane or a lacquer. Accordingly, a good adhesion of the protective material 150 on the housing 110 (e.g. composed of molding compound) and also a low viscosity (i.e. a good filling behavior) can be made possible.

As indicated in FIG. 1, the protective material can also be applied on further electrical contacts of the semiconductor chip 120 and of the housing 110 and also on regions adjacent thereto of a bond wire which connects the electrical contacts. In FIG. 1, this is shown purely by way of example for the further electrical contact 122 of the semiconductor chip 120, which is connected to the further electrical contact 113 of the housing 110 via the further bond wire 131. The protective material 150 is applied on the further electrical contact 122 of the semiconductor chip 120, on the further electrical contact 113 of the housing 110 and also on the regions of the further bond wire 131 which are adjacent to the two electrical contacts.

The region of the bond wire 130 which is adjacent to the electrical contact 121 of the semiconductor chip 120 and also the region of the bond wire 130 which is adjacent to the electrical contact 112 of the housing 110, which regions are covered by the protective material 150, extend in each case only over a fraction of the length of the bond wire 130. In this way it is possible to achieve a compromise between protecting the bond wire 130 and also the connections to the electrical contacts 112, 121 against the aggressive media and avoiding the introduction of mechanical stress into the semiconductor chip 120. Since the protective material 150 is applied only in each case along a fraction of the length of the bond wire 130, the mechanical stress introduced into the semiconductor chip 120 on account of the additional protective material 150 can be limited. At the same time the particularly sensitive regions of the bond wire 130 in the regions of connection to the electrical contacts 112, 121 (the bond wire 130 can be thinner here) can be protected. By way of example, the region of the bond wire 130 which is adjacent to the electrical contact 121 of the semiconductor chip 120 can extend over less than 10%, 15%, 20%, 25%, 30%, 35% or 40% of the length of the bond wire 130. Likewise, the region of the bond wire 130 which is adjacent to the electrical contact 112 of the housing 110 can extend over less than 10%, 15%, 20%, 25%, 30%, 35% or 40% of the length of the bond wire 130. This can likewise apply when the protective material 150 is applied on further bond wires within the semiconductor component 100 (e.g. bond wire 131).

The production of the semiconductor component 100 can comprise chip (die) and wire bonding of the semiconductor chip 120 into the cavity 111 of the housing 110. In other words: firstly, the method comprises providing the housing 110, wherein at least the semiconductor chip 120 is arranged in the cavity 111 of the housing 110 and furthermore the electrical contact 121 of the semiconductor chip 120 is connected to the electrical contact 112 of the housing 110 via the bond wire 130.

This is followed by selectively applying the additional protective material 150 on the metal connection pads, including the wire connections. In other words: the method furthermore comprises applying the protective material 150 on the electrical contact 121 of the semiconductor chip 120 and also on the region of the bond wire 130 which is adjacent to the electrical contact 121 of the semiconductor chip 120, and on the electrical contact 112 of the housing 110 and also on the region of the bond wire 130 which is adjacent to the electrical contact 112 of the housing 110.

Applying the protective material 150 can be carried out in diverse ways here. By way of example, the protective material 150 can be applied without the use of a mask. This can be done for instance by dispensing or jetting the protective material 150.

Alternatively, the protective layer (i.e. the protective material 150) can be deposited by means of a respective mask. In other words: applying the protective material 150 can comprise depositing the protective material 150 into the cavity 111. By way of example, the protective material 150 can be applied by means of vapor deposition or by spraying. Applying the protective material 150 then furthermore comprises forming a photoresist structure, etching a part of the protective material which is not covered by the photoresist structure, and also subsequently removing the photoresist structure.

The method is concluded by filling at least one partial region of the cavity 111 with the gel 140 (e.g. a silicone gel). As indicated in FIG. 1, filling at least the partial region of the cavity 111 with the gel 140 comprises completely encapsulating the semiconductor chip 120, the electrical contact 112 of the housing 110 and the bond wire 130 (and also the further electrical connections between semiconductor chip 120 and housing 110) with the gel 140.

Furthermore, the production of the semiconductor component 100 can comprise curing the protective material 150.

In order to avoid uncontrolled spreading/dispersing/bleeding of the protective material 150, elevations are moreover also provided in the semiconductor component 100, which elevations at least partly border the electrical contacts covered by the protective material 150. The selectivity of the application of the protective material 150 can be supported by the additional use of these "compound stops". In the case of protective material 150 having low surface tension or low viscosity, undesired spreading of the protective material 150 can be avoided by means of elevations which are chemically robust and have a high surface tension or high viscosity (e.g. plastic or molding compound).

As indicated in FIG. 1, a first elevation 114 is formed in the housing 110, which first elevation at least partly borders the electrical contact 112 of the housing 110. In the case of the example shown in FIG. 1, the electrical contact 112 is formed in a manner adjoining a lateral boundary (sidewall) 115 of the housing 110. Accordingly, it is sufficient if the elevation 114 only partly borders the electrical contact 112 of the housing 110. For its part, the lateral boundary 115 of the housing 110 likewise forms a natural boundary for the protective material 150. As is evident from FIG. 1, the protective material 150 is introduced into the volume enclosed by the first elevation 114 above the electrical contact 112 of the housing 110. Accordingly, uncontrolled spreading of the protective material 150 can be prevented, such that the protective material 150 covers only the electrical contact 112 of the housing 110 and also the region of the bond wire 130 which is adjacent to the electrical contact 112 of the housing 110.

The compound stop, i.e. the elevation 114, can be molded e.g. during a premold process, i.e. during the molding of the housing 110. This can be cost-effective since then an additional process for molding the elevation 114 is not necessary. Alternatively, however, the molding of the elevation 114 can also be part of some other additional provision process before or after the wire bonding of the semiconductor chip 120. In other words: providing the housing 110 can comprise forming the elevation 114 in the housing 110. Furthermore, applying the protective material 150 on the electrical contact 112 of the housing 110 and also on the region of the bond wire 130 which is adjacent to the electrical contact 112 of the housing 110 can comprise introducing the protective material 150 into the volume enclosed by the elevation 114 above the electrical contact 112 of the housing 110. As already indicated above, forming the elevation 114 in the housing 110 can be carried out before or after arranging the semiconductor chip 120 in the housing 110.

Likewise, the electrical contact 121 of the semiconductor chip 120 is at least partly bordered by a second elevation 123, wherein the protective material 150 is introduced into the volume enclosed by the second elevation 123 above the electrical contact 121 of the semiconductor chip 120. Forming (molding) the second elevation 123 can likewise be carried out by means of a provision process before or after the wire bonding of the semiconductor chip 120. Alternatively, on the semiconductor chip 120, it is possible to produce e.g. a respective frame around the chip/die connection pads at the wafer level. By way of example, on the semiconductor chip 120 a polyimide or a resin can be deposited on the semiconductor chip 120 and be patterned by means of lithographic methods in order to form the second elevation 123. In other words: providing the housing 110 can comprise forming the elevation 123 on the semiconductor chip 120, wherein applying the protective material 150 on the electrical contact 121 of the semiconductor chip 120 and also on the region of the bond wire 130 which is adjacent to the electrical contact 121 of the semiconductor chip 120 comprises introducing the protective material 150 into the volume enclosed by the elevation 123 above the electrical contact 121 of the semiconductor chip 120. As already indicated above, forming the elevation 123 on the semiconductor chip 120 can also be carried out before or after arranging the semiconductor chip 120 in the housing 110.

As shown in FIG. 1 in association with the further electrical contact 122 of the semiconductor chip 120, the further electrical contact 113 of the housing 110 and also the regions of the further bond wire 131 which are adjacent to the two electrical contacts, the protective material 150 can also be used without elevations or compound stops. Elevations or compound stops can be dispensed with, for example, if the protective material has a relatively high surface tension or a relatively high viscosity.

In the case of the semiconductor component 100 shown in FIG. 1, the electrical contact 121 of the semiconductor chip 120, the electrical contact 112 of the housing 110 and also the regions of the bond wire 130 which are adjacent to the electrical contacts are covered with the protective material. In some exemplary embodiments, it is also possible in each case for only the electrical contact of the semiconductor chip and also the region of the bond wire which is adjacent thereto or the electrical contact of the housing together with the region of the bond wire which is adjacent thereto to be covered with the protective material. This is shown by way of example in FIG. 2.

Figure 2:
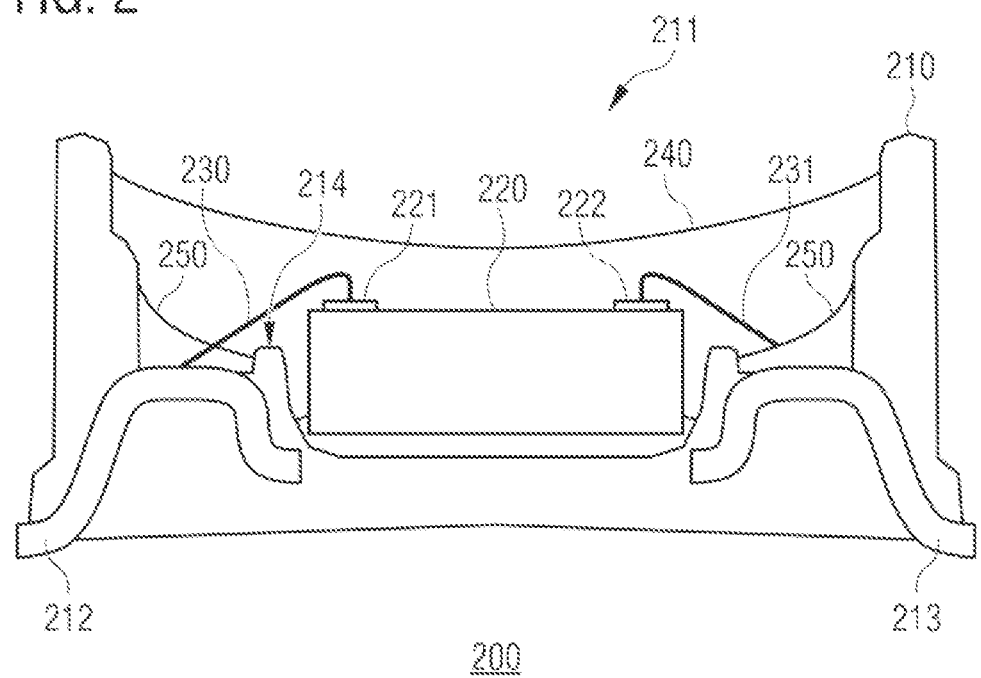
FIG. 2 shows a second exemplary embodiment of a semiconductor component.

In the case of the semiconductor component 200 shown in FIG. 2, in contrast to the semiconductor component 100 in FIG. 1, the protective material 250 is applied only on the electrical contact 212 of the housing 210 and also on a region of the bond wire 230 which is adjacent to the electrical contact 212 of the housing 210. No protective material is applied on the electrical contact 221 of the semiconductor chip 220 and also on the region of the bond wire 230 which is adjacent to the electrical contact 221 of the semiconductor chip 220.

In order to prevent uncontrolled spreading of the protective material 250 in the cavity 211 of the housing 210, once again an elevation 214 is formed, which partly borders the electrical contact 212 of the housing 210.

Accordingly, the protective material 250 is also applied on the further electrical contact 213 of the housing 210 and also on a region of the further bond wire 231 which is adjacent to the further electrical contact 213 of the housing 210. Likewise, no protective material is applied on the further electrical contact 222 of the semiconductor chip 220 and also on the region of the further bond wire 231 which is adjacent to the further electrical contact 222 of the semiconductor chip 220.

Moreover, at least one partial region of the cavity 211 is once again filled with a gel 240.

In accordance with some exemplary embodiments, the protective material can alternatively also be applied only on the electrical contact of the semiconductor chip and also on the region of the bond wire which is adjacent to the electrical contact of the semiconductor chip 220, while no protective material is applied on the electrical contact of the housing and also on a region of the bond wire which is adjacent to the electrical contact of the housing.

Figure 3:
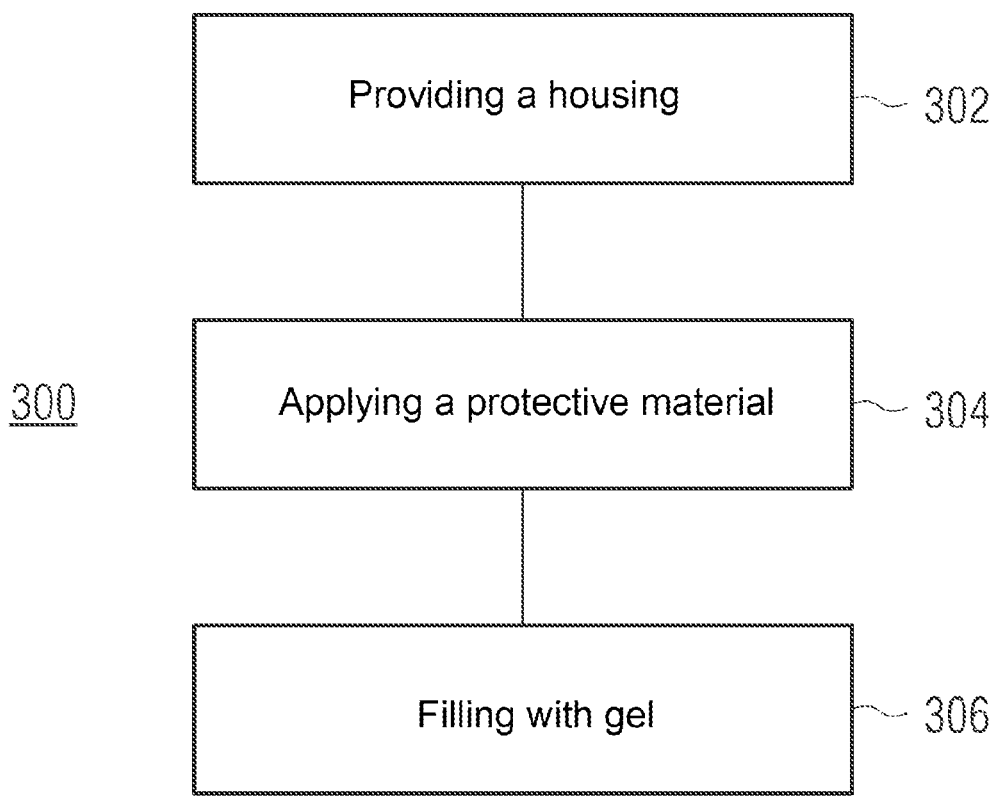
FIG. 3 shows a flow diagram of one exemplary embodiment of a method for producing a semiconductor component.

In order once again to summarize the above-described aspects for producing semiconductor components in accordance with the proposed architecture, a flow diagram of a method 300 for producing a semiconductor component is shown in FIG. 3.

The method 300 comprises providing 302 a housing. A semiconductor chip is arranged in a cavity of the housing. Furthermore, an electrical contact of the semiconductor chip is connected to an electrical contact of the housing via a bond wire. The method 300 furthermore comprises applying 304 a protective material on the electrical contact of the semiconductor chip and also on a region of the bond wire which is adjacent to the electrical contact of the semiconductor chip, and/or on the electrical contact of the housing and also on a region of the bond wire which is adjacent to the electrical contact of the housing. Moreover, the method 300 also comprises filling 306 at least one partial region of the cavity with a gel.

The method 300 can enable the production of semiconductor components with an increased robustness vis-à-vis aggressive media. Accordingly, a susceptibility to corrosion and thus a reliability of the semiconductor components produced in accordance with the method 300 can be improved. In other words: method 300 can enable an improved reliability for gel-encapsulated semiconductor chips/dies which are secured in cavity packages. In particular, method 300 can enable this by the deposition of a protective layer (e.g. epoxy resin) onto the wire/connection pad interconnects before gel dispensing. In some exemplary embodiments, this can be supported by a compound stop structure in order thus to avoid bleeding effects.

Further details and aspects of the method 300 have been described above in association with one or more further exemplary embodiments. The method 300 can comprise one or more optional features in accordance with one or more of the further exemplary embodiments.

The principles described above can be used for any applications comprising chips having a molded encapsulation that are secured in cavity packages. For example, for sensor or power applications, MEMS applications, pressure sensors, automotive charge air pressure applications. In particular, the principles described above can be applied to wire/substrate interconnects and/or to wire/chip interconnects. A combination of the protective material with a compound stop structure can be optional and useful.

The aspects and features that have been described together with one or more of the examples and figures detailed above can also be combined with one or more of the other examples in order to replace an identical feature of the other example or in order additionally to introduce the feature into the other example.

The description and drawings present only the principles of the disclosure. Furthermore, all examples mentioned here are intended in principle to serve expressly only for teaching purposes, in order to assist the reader in understanding the principles of the disclosure and the concepts contributed by the inventor(s) for further development of the art. All statements herein regarding principles, aspects and examples of the disclosure and also concrete examples thereof encompass the counterparts thereof.

It goes without saying that the disclosure of a plurality of steps, processes, operations or functions disclosed in the description or the claims should not be interpreted as being in the specific order, unless this is explicitly or implicitly indicated otherwise, e.g. for technical reasons. The disclosure of a plurality of steps or functions therefore does not limit them to a specific order, unless said steps or functions are not interchangeable for technical reasons. Furthermore, in some examples, an individual step, function, process or operation can include a plurality of partial steps, functions, processes or operations and/or be subdivided into them. Such partial steps can be included and be part of the disclosure of said individual step, provided that they are not explicitly excluded.

Furthermore, the claims that follow are hereby incorporated in the detailed description, where each claim can be representative of a separate example by itself. While each claim can be representative of a separate example by itself, it should be taken into consideration that—although a dependent claim can refer in the claims to a specific combination with one or more other claims—other examples can also encompass a combination of the dependent claim with the subject matter of any other dependent or independent claim. Such combinations are explicitly proposed here, provided that no indication is given that a specific combination is not intended. Furthermore, features of a claim are intended also to be included for any other independent claim, even if this claim is not made directly dependent on the independent claim.

What is claimed is:

1. A method for producing a semiconductor component, the method comprising:
providing a housing comprising a base and vertical sidewalls that extend vertically from the base, wherein the base and the vertical sidewalls define a cavity, wherein the base includes at least one elevation structure that protrudes vertically from the base such that a first recess is formed between a first vertical sidewall and the at least one elevation structure and a second recess is formed by a depression formed in the base between vertical protrusions of the at least one elevation structure;

providing a semiconductor chip in the second recess between the vertical protrusions of the at least one elevation structure;

forming a first electrical contact of the housing, wherein a portion of the first electrical contact of the housing is arranged at and defines a bottom of the first recess, wherein a first electrical contact of the semiconductor chip is connected to the portion of the first electrical contact of the housing via a first bond wire, wherein the at least one elevation structure protrudes vertically from the bottom of the first recess such that the first recess includes a lateral gap formed between the first vertical sidewall and the at least one elevation structure, and wherein the first bond wire includes a first bond wire portion arranged within the lateral gap and in contact with the portion of the first electrical contact of the housing;

applying a protective material within the lateral gap of the first recess including directly on the portion of the first electrical contact of the housing and also on the first bond wire portion such that the first bond wire portion is encapsulated by the protective material; and filling at least one partial region of the cavity, including covering the protective material disposed in the first recess, with a gel.

2. The method of claim 1, wherein a third recess is formed between a second vertical sidewall of the housing and the at least one elevation structure, and the method further comprises:

forming a second electrical contact of the housing, wherein a portion of the second electrical contact of the housing is arranged at a bottom of the third recess, wherein a second electrical contact of the semiconductor chip is connected to the portion of the second electrical contact of the housing via a second bond wire;

applying the protective material within the third recess including on the second electrical contact of the housing and also on a region of the second bond wire that is adjacent to the second electrical contact of the housing; and covering the protective material disposed in the third recess with the gel.

3. The method of claim 2, wherein the protective material disposed in the first recess and the protective material disposed in the third recess are separated by a gap spanning at least the second recess.

4. The method of claim 3, wherein filling at least one partial region of the cavity with the gel includes filling a portion of the second recess with the gel.

5. The method of claim 4, wherein filling at least one partial region of the cavity with the gel includes covering the semiconductor chip, the first electrical contact of the semiconductor chip, and the second electrical contact of the semiconductor chip with the gel.

6. The method of claim 1,
wherein applying the protective material on the first electrical contact of the housing and also on the first bond wire portion of the first bond wire which is adjacent to the first electrical contact of the housing comprises introducing the protective material into a space located above the first electrical contact of the housing between the at least one elevation structure and the first vertical sidewall.

7. The method of claim 1, wherein forming the at least one elevation structure in the housing is carried out before arranging the semiconductor chip in the second recess of the housing.

8. The method of claim 1, wherein forming the at least one elevation structure in the housing is carried out after arranging the semiconductor chip in the second recess of the housing.

9. The method of claim 1, wherein the protective material is an epoxy resin and the gel is a silicone gel.

10. The method of claim 1, wherein the semiconductor chip is a MicroElectroMechanical System (MEMS) sensor.

11. The method of claim 10, wherein the MEMS sensor is a pressure sensor.

12. The method of claim 1, wherein the first electrical contact of the housing delimits the cavity.

13. The method of claim 1, wherein applying the protective material comprises dispensing or jetting the protective material.

14. The method of claim 1, wherein applying the protective material comprises:
depositing the protective material into the cavity;
forming a photoresist structure;
etching a part of the protective material that is not covered by the photoresist structure; and
removing the photoresist structure.

15. A method for producing a semiconductor component, the method comprising:
providing a housing comprising a base and vertical sidewalls that extend vertically from the base, wherein the base and the vertical sidewalls define a cavity, wherein the base includes at least one elevation structure that protrudes vertically therefrom such that a first recess is formed between a first vertical sidewall and the at least one elevation structure and a second recess is formed by a depression formed in the base between vertical protrusions of the at least one elevation structure;
providing a semiconductor chip in the second recess between the vertical protrusions of the at least one elevation structure;
forming a first electrical contact of the housing, wherein a portion of the first electrical contact of the housing is arranged at a bottom of the first recess, wherein a first electrical contact of the semiconductor chip is connected to the portion of the first electrical contact of the housing via a first bond wire;
applying a protective material within the first recess including on the first electrical contact of the housing and also on a region of the first bond wire that is adjacent to the first electrical contact of the housing; and
filling at least one partial region of the cavity, including covering the protective material disposed in the first recess, with a gel,
wherein filling at least the partial region of the cavity with the gel comprises completely encapsulating the semiconductor chip, the first electrical contact of the housing, and the first bond wire with the gel.

16. A semiconductor component, comprising:
a housing comprising a base and vertical sidewalls that extend vertically from the base, wherein the base and the vertical sidewalls define a cavity, wherein the base includes at least one elevation structure that protrudes vertically therefrom such that a first recess is formed between a first vertical sidewall and the at least one elevation structure and a second recess is formed by a depression formed in the base between vertical protrusions of the at least one elevation structure;
a first bond wire;
a first electrical contact of the housing, wherein a portion of the first electrical contact of the housing is arranged at and defines a bottom of the first recess;
a semiconductor chip arranged in the second recess between the vertical protrusions of the at least one elevation structure, wherein the semiconductor chip comprises a first electrical contact of the semiconductor chip that is connected to the portion of the first electrical contact of the housing via the first bond wire, wherein the at least one elevation structure protrudes vertically from the bottom of the first recess such that the first recess includes a lateral gap formed between first vertical sidewall and the at least one elevation structure, and wherein the first bond wire includes a first bond wire portion arranged within the lateral gap and in contact with the portion of the first electrical contact of the housing;
a protective material provided within lateral gap of the first recess including directly on the portion of the first electrical contact of the housing and also on the first bond wire portion such that the first bond wire portion is encapsulated by the protective material; and
a gel that fills at least one partial region of the cavity, including covering the protective material disposed in the first recess.

17. The semiconductor component of claim 16, further comprising:
a third recess formed between a second vertical sidewall of the housing and the at least one elevation structure;
a second bond wire; and
a second electrical contact of the housing, wherein a portion of the second electrical contact of the housing is arranged at a bottom of the third recess,
wherein the semiconductor chip comprises a second electrical contact of the semiconductor chip that is connected to the portion of the second electrical contact of the housing via the second bond wire;
wherein the protective material is provided within the third recess including on the second electrical contact of the housing and also on a region of the second bond wire that is adjacent to the second electrical contact of the housing, and
wherein the gel covers the protective material disposed in the third recess.

18. The semiconductor component of claim 17, wherein the protective material disposed in the first recess and the protective material disposed in the third recess are separated by a gap spanning at least the second recess.

19. The semiconductor component of claim 18, wherein the gel fills at least a portion of the second recess.

20. The semiconductor component of claim 19, wherein the gel covers the semiconductor chip, the first electrical contact of the semiconductor chip, and the second electrical contact of the semiconductor chip.

21. The semiconductor component of claim 16, wherein the protective material is an epoxy resin and the gel is a silicone gel.

22. The semiconductor component of claim 16, wherein the semiconductor chip is a MicroElectroMechanical System (MEMS) sensor.

23. The semiconductor component of claim 22, wherein the MEMS sensor is a pressure sensor.

24. The semiconductor component of claim 16, wherein the first electrical contact of the housing delimits the cavity.

25. The semiconductor component of claim 16, wherein the gel completely encapsulates the protective material, the semiconductor chip, the first electrical contact of the housing, and the first bond wire.

* * * * *